United States Patent
Manako

[11] Patent Number: 5,979,474
[45] Date of Patent: Nov. 9, 1999

[54] CLEANING EQUIPMENT FOR SEMICONDUCTOR SUBSTRATES

[75] Inventor: Kazuyoshi Manako, Saga, Japan

[73] Assignee: Sumitomo Sitix Corporation, Hyogo, Japan

[21] Appl. No.: 09/076,119

[22] Filed: May 12, 1998

[51] Int. Cl.[6] ..................................................... B08B 3/04
[52] U.S. Cl. .................. 134/102.1; 134/108; 134/102.1; 134/902
[58] Field of Search ..................................... 134/902, 133, 134/134, 200, 114, 186, 102.1, 105, 107, 108

[56] References Cited

U.S. PATENT DOCUMENTS

| | | | |
|---|---|---|---|
| 4,727,896 | 3/1988 | Kanazawa et al. | 134/102.1 |
| 5,069,235 | 12/1991 | Vetter et al. | 134/902 |
| 5,326,035 | 7/1994 | Ohmi et al. | 134/902 |
| 5,415,191 | 5/1995 | Mashimo et al. | 134/902 |
| 5,447,640 | 9/1995 | Omi et al. . | |
| 5,681,396 | 10/1997 | Madanshetty | 134/902 |
| 5,776,296 | 7/1998 | Matthews | 134/902 |
| 5,800,626 | 9/1998 | Cohen et al. | 134/1.3 |
| 5,849,091 | 12/1998 | Skrovan et al. | 134/902 |

Primary Examiner—Frankie L. Stinson
Attorney, Agent, or Firm—Kanesaka & Takeuchi

[57] ABSTRACT

A cleaning equipment for semiconductor substrates, which includes a cleaning tank 2 for cleaning the semiconductor substrates and a circulation filtering device, wherein the cleaning equipment has a pump 6 and a filter unit 7 disposed in a filtering line for cleaning impurities contained in a cleaning liquid, a gas mixing device 8 having a temperature-adjusting function and which is disposed downstream of the pump 6 and the filter unit 7 for adjusting a temperature of the cleaning liquid and dissolving the gas into the cleaning liquid, and a gas-separating device 9 which is disposed downstream of the gas mixing device 8 for separating an undissolved portion of the mixed gas from the cleaning liquid.

3 Claims, 3 Drawing Sheets

CLEANING EQUIPMENT FOR SEMICONDUCTOR SUBSTRATES

BACKGROUND OF THE INVENTION

1. Field of the Invention

The invention relates to cleaning equipment, which is used in a cleaning process for manufacturing silicon wafers for semiconductor substrates and in a cleaning process for manufacturing semiconductor devices using semiconductor substrates (hereinafter also referred to as a term "wafer"), and also to a cleaning equipment using a treating solution mixed with an oxidizing gas.

2. Description of the Related Art

Conventional means for removing impurities from wafers include a method to treat with a liquid having an etching action, which can remove impurities present on the surface and in the neighborhood of the surface.

An effective method for removing impurities has a simultaneous action of oxidizing and etching. This cleaning method having the oxidizing and etching abilities is known to include an FPM (DHF/$H_2O_2$: hydrofluoric acid hydrogen peroxide mixture) cleaning method (Japanese Patent Application Laid-Open No. Hei 3-120719) combining DHF (diluted hydrofluoric acid) and $H_2O_2$, and a cleaning method using an oxidizing gas instead of $H_2O_2$. These methods remove impurities present on the surface-oxidized layer by the following action of DHF.

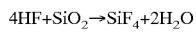

$$4HF + SiO_2 \rightarrow SiF_4 + 2H_2O$$

Besides, impurities can be removed more effectively by oxidizing Si activated by $H_2O_2$ to form a film on the wafer surface.

These cleaning methods have an etching rate determined depending on a temperature of the cleaning liquid. Especially, a DHF/oxidizing gas method, namely a method for cleaning by babbling or dissolving a gas such as $O_3$ into DHF to directly apply to the wafer, has the dissolving and decomposing of an oxidizing gas affected by the temperature of the cleaning liquid, and an oxidizing rate is also varied as a result. Therefore, there has been proposed a method of cleaning by bubbling the oxidizing gas in order to obtain a sufficient oxidizing effect.

But, according to the above-described cleaning methods, to clean a wafer placed in a carrier, gas is not easy to act on the wafer surface, and especially the gas is difficult to reach the portions where the wafer is contacted with the wafer carrier, and a uniform cleaning effect on the wafer surface and through the wafer plane cannot be obtained with ease.

Therefore, the method of dissolving the oxidizing gas into the cleaning liquid to give an oxidizing effect to the cleaning liquid is effective. But, since the oxidizing gas is easy to decompose, and it is not dissolved with ease.

To solve such problems, the following factors are named.

(a) Henry's law controlling the solubility of gas includes the following:

(1) a concentration of solute: the solubility becomes high when the solute has a high concentration, namely gas has a high concentration;

(2) a kind of solvent: the solubility of gas is variable depending on the presence or not of polarity;

(3) a temperature of solvent: the solubility of gas becomes high when the solvent has a low temperature;

(4) a partial pressure of gas: the solubility becomes high when the gas has a high partial pressure; and (5) a contact area between solute and solvent: the solubility becomes high when the contact area between the solute and the solvent is large.

(b) Etching rate of silicon by DHF is determined by the following factors:

(1) a concentration of HF: the etching rate becomes high when the concentration of HF is high; and (2) a temperature of solution: the etching rate becomes high when the solution has a high temperature, and when the treating liquid is flowing to circulate, its flow rate also has some influence.

In the DHF/oxidizing gas method, the etching rate of wafer varies depending on not only the etching rate of HF but also the oxidizing rate of the oxidizing gas. Therefore, it is significant to adjust a temperature of the treating liquid, which is a factor common to the etching rate of HF and the solubility of the oxidizing gas. Besides, to keep the action of the treating solution uniform, it is necessary to adjust the concentration of HF and the dissolving amount of the oxidizing gas.

SUMMARY OF THE INVENTION

In view of the above, it is an object of the present invention to provide a cleaning equipment for semiconductor substrates, which can stably clean wafers by adjusting a temperature of a treating liquid and a dissolved amount of an oxidizing gas, and uniformly supplying a cleaning liquid containing the oxidizing gas, with the dissolved amount adjusted, to the wafer surface.

The invention relates to a cleaning equipment for semiconductor substrates provided with a cleaning tank for cleaning the semiconductor substrates and a circulation filtering device, the cleaning equipment comprising a pump and a filter unit, which are disposed in a filtering line for cleaning impurities contained in a cleaning liquid; a gas mixing device having a temperature-adjusting function, which is disposed downstream of the pump and the filter unit to adjust a temperature of the cleaning liquid and to dissolve gas into the cleaning liquid; and a gas-separating device, which is disposed downstream of the gas mixing device to separate an undissolved portion of the mixed gas from the cleaning liquid.

In the present invention, the gas mixed into the cleaning liquid is not injected into an atmospheric releasing tank such as the cleaning tank but sent into a sealed system in the circulation filtering line, so that a partial pressure is increased, and a dissolving efficiency is improved. Besides, since the gas separating device is provided, the undissolved portion (an excessively supplied portion) of the mixed gas is prevented from reaching the treating tank.

The invention described in claim 2 relates to the cleaning equipment for semiconductor substrates as set forth in claim 1, wherein the gas mixing device having a temperature-adjusting function is configured to have a dual structure to flow the cleaning liquid on one side and a liquid, which is adjusted to have a predetermined temperature by a heat exchanger, on the other side, and a small opening for injecting the gas is formed in the tank wall on the side of the cleaning liquid.

Accordingly, the cleaning liquid can be adjusted to a determined temperature by the heat exchanging action of both liquids, and there is produced the cleaning liquid having a constant temperature. And, since the small opening for injecting the gas is formed on the tank wall on the side of the cleaning liquid having a constant temperature, the gas-liquid mixing can be made effectively.

The invention described in claim 3 relates to the cleaning equipment for semiconductor substrates as set forth in claim 1, which further comprises a tank to mix the gas and a liquid as a solvent of the gas and to continuously supply a solution which is kept at a predetermined dissolving concentration.

Accordingly, since a gas-dissolved solution having a given concentration is supplied continuously, stable cleaning can be performed.

DESCRIPTION OF THE PREFERRED EMBODIMENT

The invention will be described based on one embodiment.

Figure 1:
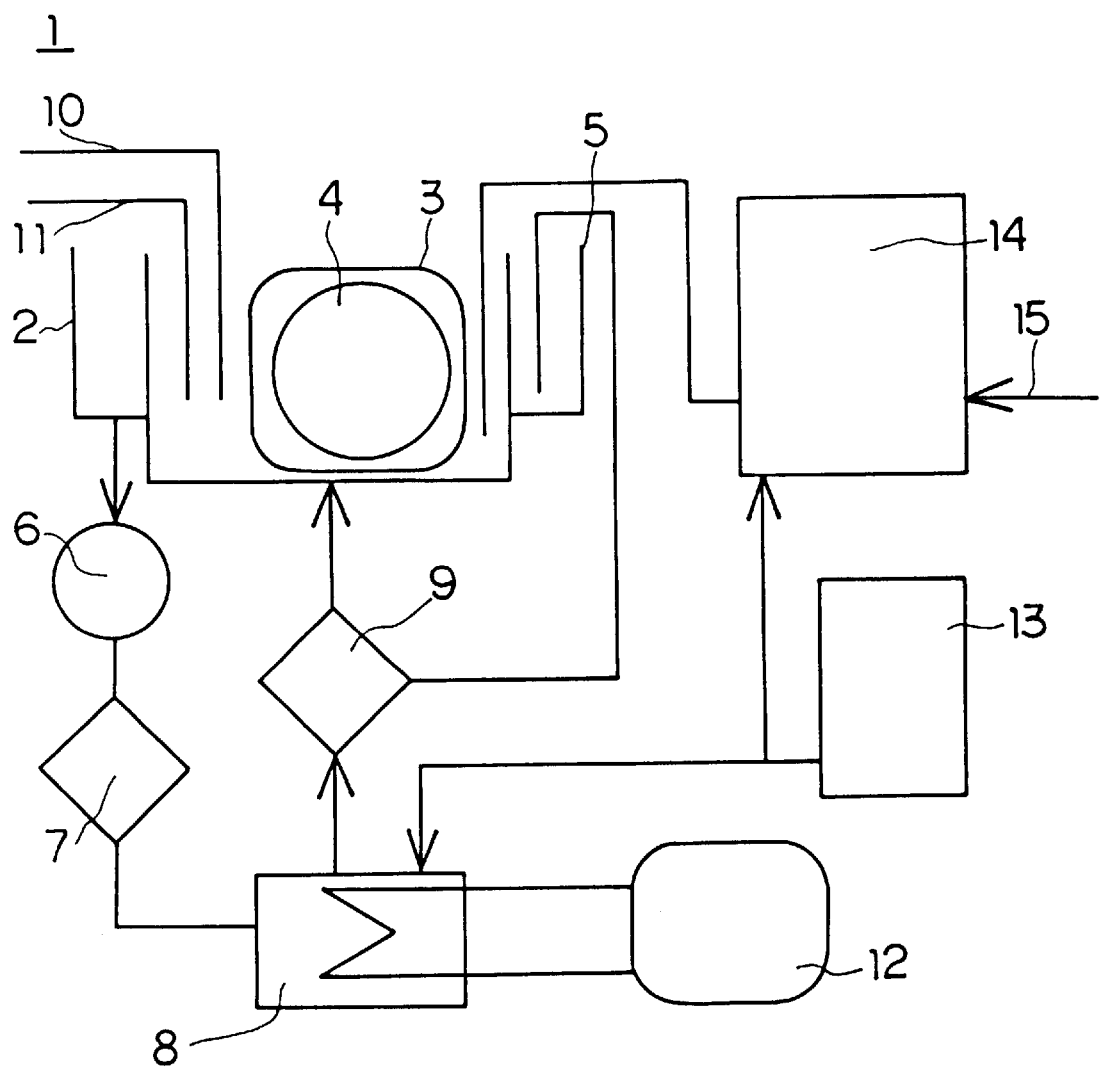
FIG. 1 is a schematic structural view showing the cleaning equipment of the invention.

FIG. 1 is an entire schematic structural view showing the cleaning equipment of this embodiment. In the drawing, the cleaning equipment 1 is provided with a cleaning tank 2 with its top open, into which pure water is supplied through a supply pipe 11, and a measured HF aqueous solution is supplied through a supply pipe 10 to have a predetermined concentration. A wafer cassette 3 is placed in the cleaning tank 2, and a wafer 4 is accommodated into the wafer cassette 3. Reference numeral 5 denotes an outer tank.

The cleaning liquid prepared by mixing both liquids is circulated by a circulating pump 6. The cleaning liquid which started to circulate is filtered through a filter 7 and adjusted for its temperature.

Then, it is sent to a gas-mixing device 8 having a temperature-adjusting function for dissolving the gas into the cleaning liquid. The gas-mixing device 8 having the temperature-adjusting function may be one which directly controls heat exchange with its heat exchange section contacted to the cleaning liquid, but may also be one which indirectly controls heat exchange between the cleaning liquid and a heat source through a substance, such as quartz glass, having a better heat exchange rate than a resin material, thereby elution of impurities into the cleaning liquid can be prevented, and the temperature can be raised or lowered to a predetermined temperature with ease. This embodiment shows the indirect control method.

Figure 2:
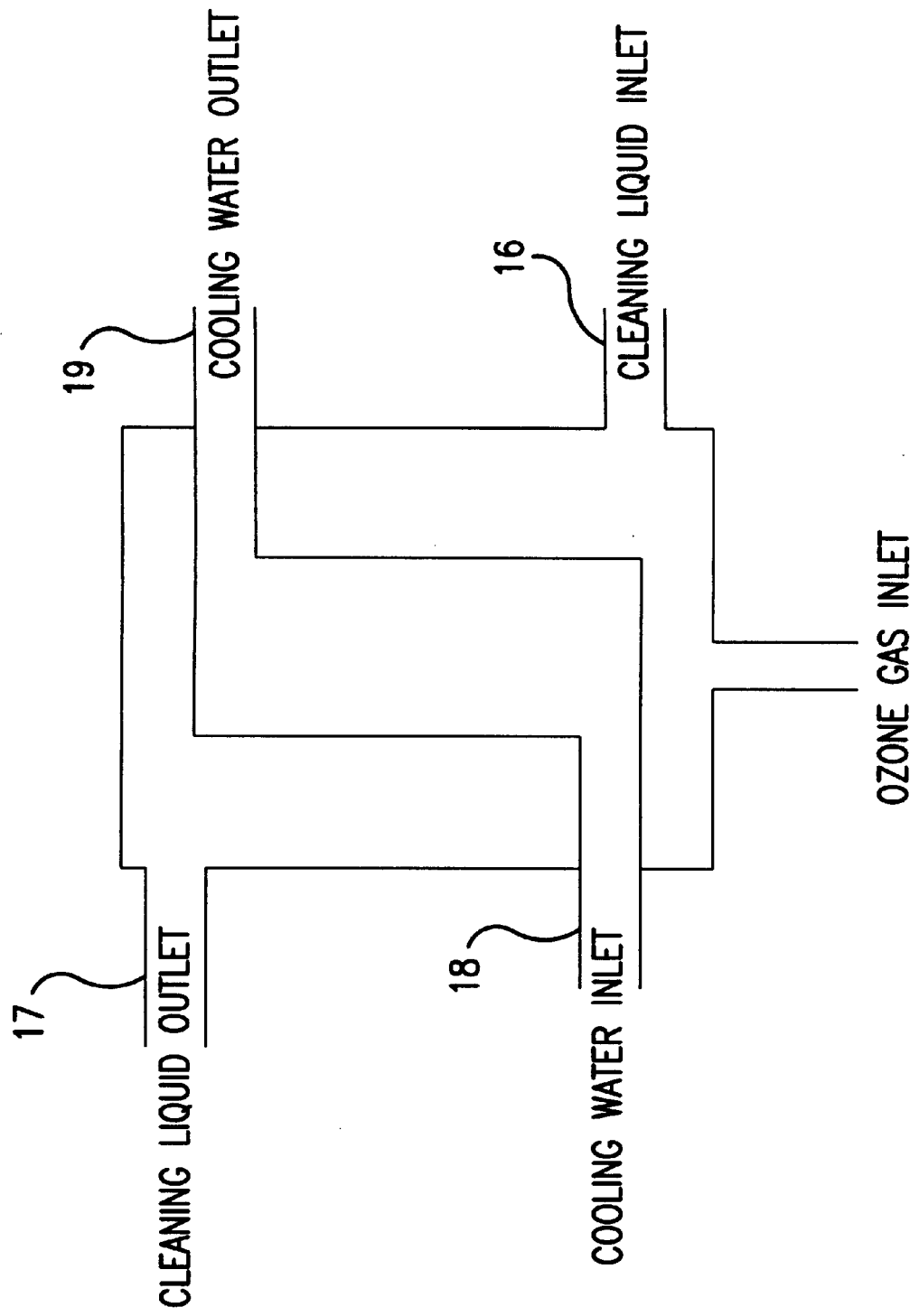
FIG. 2 is a schematic structural view of a gas mixing device having a temperature-adjusting function used in the invention.

As shown in FIG. 2, the gas-mixing device 8 having a temperature-adjusting function has a dual structure in that the liquid adjusted to have a predetermined temperature flows on one side and the cleaning liquid flows on the other side, so that the cleaning liquid can be adjusted to a desired temperature by the heat exchange between both liquids. Specifically, a cooling water inlet 18 and a cooling water outlet 19 are formed in the equipment having a cleaning liquid inlet 16 on one side and a cleaning liquid outlet 17 on the other side, and the cooling water is flown through it. The equipment is also provided with an ozone gas inlet.

Figure 3:
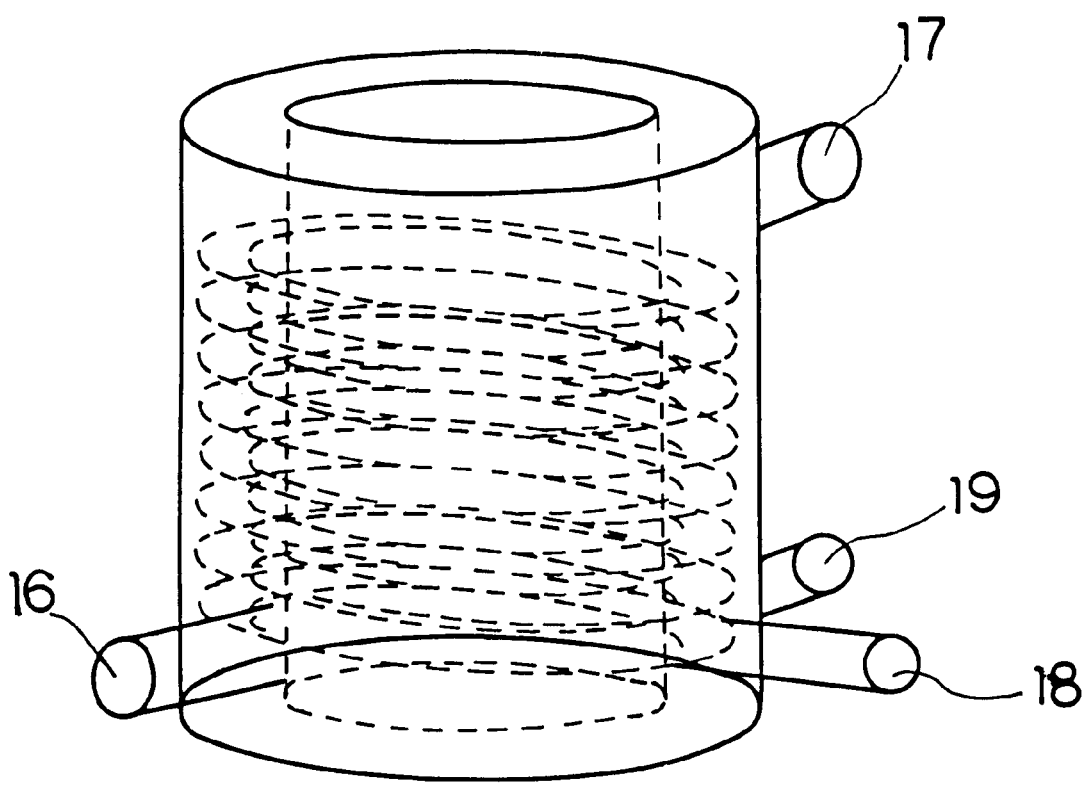
FIG. 3 is a diagram showing an embodiment of the gas mixing device having a temperature-adjusting function used in the invention.

FIG. 3 shows an embodiment of the gas-mixing device 8 having a temperature-adjusting function. The tank used to adjust a temperature of the cleaning liquid preferably has a small volume because it is provided in the circulating line of the cleaning liquid and the amount of the cleaning liquid in the heat exchange tank is preferably small. And, the heat exchange section preferably has a large surface area to have a better heat exchange rate.

Therefore, the heat exchange tank has its interior formed into a hollow doughnut cylindrical structure to have a large contact area by having a hose structure to improve a heat exchange efficiency. In the tank, the cleaning liquid flows the outside of the hose and the pure water flows through the hose to adjust the temperature.

Besides, as shown in FIG. 1, ozone gas is supplied continuously into the gas-mixing device 8 having a temperature-adjusting function to dissolve the ozone gas into the cleaning liquid. Undissolved portion of the supplied ozone gas is removed by a gas-separating device 9 and returned to the outer tank 5.

In the circulating line, the ozone gas is supplied after the cleaning liquid has passed through the pump and the filter. For example, when the ozone gas is supplied from the suction side of the pump, the ozone gas is decomposed due to a change in pressure, or the dissolved ozone is freed and dissolving time to reach a predetermined concentration takes ten times or more the time taken by the equipment of this embodiment.

The dissolved ozone is easy to decompose, and an etching rate is changed due to the change in ozone concentration. Accordingly, ozone is continuously supplemented by the heat exchange tank to enable the constant supply of ozone at a constant concentration into the cleaning tank.

In rinsing after cleaning, a conventional overflow method suffers from a degraded resistivity due to stagnation, but by a quick dump method, a cleaning liquid residue on the wafer surface can be removed quickly and effectively. The quick dump rinsing can be made for both pure water and ozone-dissolved water.

The ozone-dissolved water having a predetermined concentration is prepared by continuously supplying pure water and ozone gas through an ozone water-producing tank 14 and stirring inside the ozone water-producing tank.

The gas residue of the dissolved ozone gas is removed by a gas separator (not shown) and the produced water is supplied as the ozone-dissolved water into a rinsing tank (not shown).

By the quick dump rinsing treatment with the ozone-dissolved water, organic substances on the wafer surface are decreased, and a very clean oxide film having a very little impurity can be produced.

And, the ozone-dissolved water prepared in the ozone-dissolved water-producing tank 14 can be supplied to the cleaning tank 2, in which the quick dump rinsing can be made with the ozone-dissolved water.

With the cleaning equipment of this embodiment, the cleaning liquid is adjusted to have a temperature most effective as the cleaning liquid by a device having a heat exchange function, and the oxidizing gas is dissolved therein until it reaches a predetermined concentration.

The undissolved portion of the oxidizing gas solidifies owing to pulsation of the pump to reach into the treating tank and prevents the treated cleaning liquid from contacting the wafer. Therefore, the oxidizing gas and the cleaning liquid are separated by degasing means provided before the cleaning tank.

And, since the oxidizing gas and the cleaning liquid are separated, and the liquid in which the oxidizing gas has been dissolved fully is supplied into the cleaning tank, uniform etching and oxidizing action can always be effected.

And, the cleaned wafer is rinsed with the pure water or oxidizing gas dissolved water. The oxidizing gas dissolved water is dissolved by supplying the oxidizing gas and the pure water continuously into a sealed tank (not having an atmospheric releasing surface like the cleaning tank), and stirring is made to increase the contact area for dissolving. And, a flow rate and a temperature of the oxidizing gas being supplied are adjusted, thus the dissolved gas concentration is adjusted to a constant level.

The present invention is configured as described above, and by controlling a temperature of the treating liquid, an etching ability of HF and an oxidizing ability of ozone are kept constant and the cleaning liquid having a stable action and effect can be obtained. Furthermore, since the mixing ratio of the cleaning liquid by mixing HF and the ozone-dissolved water can be kept constant, the cleaning liquid capable of stably cleaning the wafer surface can be used continuously.

What is claimed is:

1. A cleaning equipment for semiconductor substrates, which includes a cleaning tank for cleaning the semiconductor substrates, and a circulation filtering device, comprising:

a pump and a filter unit which are disposed in a filtering line for cleaning impurities contained in a cleaning liquid;

a gas mixing device having a temperature-adjusting function and which is disposed downstream of the pump and the filter unit for adjusting a temperature of the cleaning liquid and dissolving the gas into the cleaning liquid; and a gas-separating device which is disposed downstream of the gas mixing device for separating an undissolved portion of the mixed gas from the cleaning liquid.

2. The cleaning equipment for semiconductor substrates as recited in claim 1, wherein the gas mixing device having the temperature-adjusting function is configured to have a dual structure for flowing the cleaning liquid on one side and a liquid, with its temperature being adjusted to a predetermined temperature by a heat exchanger, on the other side, and the tank wall on the side of the cleaning liquid includes a small opening formed therein for injecting the gas.

3. The cleaning equipment for semiconductor substrates as recited in claim 1, further comprising a tank for mixing the gas with a liquid serving as a solvent of the gas and continuously supplying a solution which is kept at a predetermined dissolving concentration.

* * * * *